United States Patent

Kuhn et al.

[15] 3,667,004

[45] May 30, 1972

[54] ELECTROLUMINESCENT SEMICONDUCTOR DISPLAY APPARATUS

[72] Inventors: Matthew Kuhn, Warren Township, Somerset County; Norman Edwin Schumaker, North Plainfield, both of N.J.

[73] Assignee: Bell Telephone Laboratories, Incorporated, Murray Hill, Berkeley Heights, N.J.

[22] Filed: Oct. 26, 1970

[21] Appl. No.: 84,049

[52] U.S. Cl. ..................317/234 R, 317/234 N, 317/235 N, 317/235 AK

[51] Int. Cl. .......................................................H01l 15/00

[58] Field of Search....................317/235 N, 234 N, 235 AK; 313/108 B, 108 D, 114

[56] References Cited

OTHER PUBLICATIONS ynch et al., IEEE Transactions on Electron Devices, Vol. ED- 14, No. 10, Oct. 1967, pages 705- 709.

Soul et al., Applied Physics Letters, Vol. 15, No. 7, Oct. 1, 1969, pages 229- 231.

Leite et al., Physical Review, Vol. 137, No. 5A, Mar. 1, 1965, page A1583.

*Primary Examiner*—John W. Huckert
*Assistant Examiner*—Martin H. Edlow
*Attorney*—R. J. Guenther and Arthur J. Torsiglieri

[57] ABSTRACT

An electroluminescent semiconductor display comprises a plurality of electroluminescent semiconductor devices, which are electrically connected together in a rectangular random access type of beam lead array. Each electroluminescent device includes an N-type gallium phosphide semiconductor base member of one conductivity type having a mesa in which a P-N junction is located. A beam lead array parallel to the *x* direction contacts the P-type zone through apertures in a light reflecting coating on the plateau surface of each of the mesas, whereas a beam lead array parallel to the *y* direction contacts each of the N-type base regions in two separate portions thereof, thereby avoiding the need for any leads which are in the path of the emitted light. The shape and conductivity profile of the N-type zones in the base region and the plateau are tailored in order to serve as efficient electrical crossover conductors for the beam leads in the *y* direction as well as to reduce light absorption.

10 Claims, 5 Drawing Figures

INVENTORS M. KUHN
N. E. SCHUMAKER
BY D Caplan
ATTORNEY

ELECTROLUMINESCENT SEMICONDUCTOR DISPLAY APPARATUS

FIELD OF THE INVENTION

This invention relates to solid state electroluminescent apparatus, and more particularly to semiconductor apparatus for alphanumeric visual displays.

BACKGROUND OF THE INVENTION

Individual electroluminescent semiconductor diode devices have been described previously, for example, in U. S. Pat. No. 3,470,038 issued on Sept. 30, 1969 to R. A. Logan and H. A. White. However, in many industrial applications of such devices, it is desired to have individual *xy* electrical access control over a rectangular array of such devices (alphanumeric display) with a minimum number of crossovers in the electrical access leads. Such crossovers, by reason of light absorption, lower the overall luminescent efficiency, and also complicate the processing and packaging of the array.

While P-N junction gallium phosphide semiconductor devices have a relatively high luminescent efficiency, the present difficulty of making a P-N junction in a form other than a flat surface precludes the use of purely planar technology; however, a mesa type geometry can advantageously be utilized. In such a geometry, however, typical electrical contacts absorb a substantial fraction of the light generated in the neighborhood of the P-N junction. It would therefore be desirable to have a mesa type electroluminescent diode device in which light absorption is minimized, and which is capable of being readily incorporated in an array with individual electrical random access control

SUMMARY OF THE INVENTION

In accordance with this invention, a mesa type electroluminescent semiconductor device is electrically contacted with beam leads. Advantageously, the mesa portion forms a single crystal with a base portion of the semiconductor. A P-N junction is located in the mesa, so that at least two zones of opposite conductivity are located within the mesa. Conveniently, the P-N junction in the mesa is parallel to the plateau surface of the mesa, so that the whole plateau surface is located completely within one of these zones. Electrical contact to this zone at the plateau surface is made by a single beam lead electrode through a plurality of relatively small apertures in an electrically insulating light reflecting coating on the plateau surface. The total area of these apertures is advantageously only a small fraction of the area of the plateau. Thereby, most of the light emitted at the P-N junction in the direction of the plateau surface is not absorbed, but instead is reflected back through the mesa and then transmitted through the base portion of the crystal for utilization. In addition, by reason of the relatively uniform distribution of the electrical contact through the apertures, substantially the whole P-N junction emits light uniformly as a consequence of the resulting substantially uniform current distribution across the P-N junction. Moreover, in accordance with another feature of this invention, the base portion of the semiconductor crystal advantageously has a lower net concentration of significant impurities than that of the mesa, so that light absorption losses in the base are minimized. The resulting electrical conductivity profile automatically provides improved luminescent efficiency by reason of the inherently high injection efficiency for electrons across the P-N junction. Electrical contact to the other zone of the P-N junction (i.e., the zone which is removed from the plateau surface of the mesa) is afforded by means of a beam lead electrode contact to a base portion of the crystal on the same side thereof as the mesa, in order to avoid absorption by this electrode of the light emitted at the P-N junction and transmitted through the base of the semiconductor for utilization. A rectangular array of such devices is arranged to provide a random access alphanumeric display apparatus.

In a specific embodiment of this invention, upon a major surface of an N-type gallium phosphide single crystal substrate is located an epitaxial layer of N-type gallium phosphide. Advantageously, this epitaxial layer has a lower resistivity (a higher concentration of net significant donor impurities) than that of the substrate. Upon this epitaxial layer is located another gallium phosphide epitaxial layer of P-type conductivity. Thereby, a P-N junction is formed at the interface of the epitaxial layers. Moreover, the P-type epitaxial layer contains zinc-oxygen pairs serving as recombination centers for the emission of visible red light. By means of selective crystallographic etching of the epitaxial layers, a mesa is formed containing these epitaxial layers. The substrate serves as a base (both mechanical and electrical) for the mesa portion of the semiconductor crystal. An insulating dielectric (light reflecting) coating is located upon the major surface including the plateau of the mesa. Electrodes and beam leads provide external electrical contact to the P zone at the plateau through an array of apertures in the dielectric coating on the plateau surface, thereby providing electrical access to the P zone as well as to adjacent diodes located along the *y* direction. Likewise, electrodes provide external electrical contact to the N zone through a pair of apertures in the dielectric coating of each diode. Thus, an *xy* addressable (alphanumeric) electroluminescent display apparatus is formed.

This invention together with its features, objects, and advantages may be better understood from the following detailed description when read in conjunction with the drawing (not to scale for the purpose of clarity only) in which.

Figure 1:
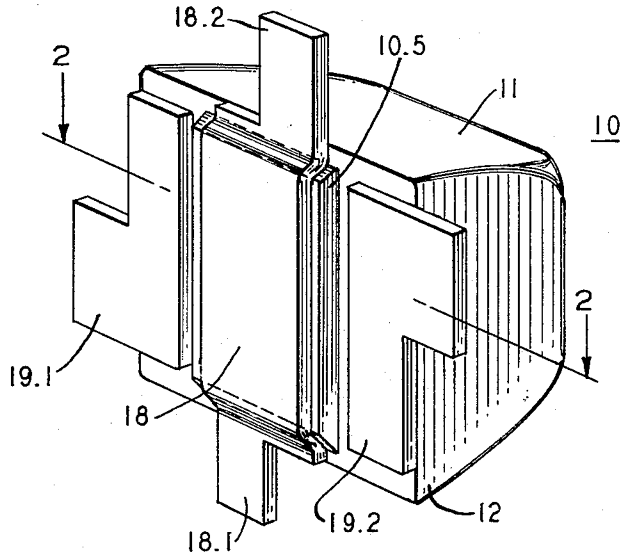
FIG. 1 is a perspective view of an electroluminescent semiconductor device, in accordance with a specific embodiment of the invention.

For the sake of clarity only, the drawing is not to scale.

DETAILED DESCRIPTION

FIG. 1 is a perspective view of an electroluminescent semiconductor device 10, having a mesa portion 10.5, and to which are attached beam leads 18, 19.1, and 19.2, in accordance with a specific embodiment of this invention.

Figure 2:
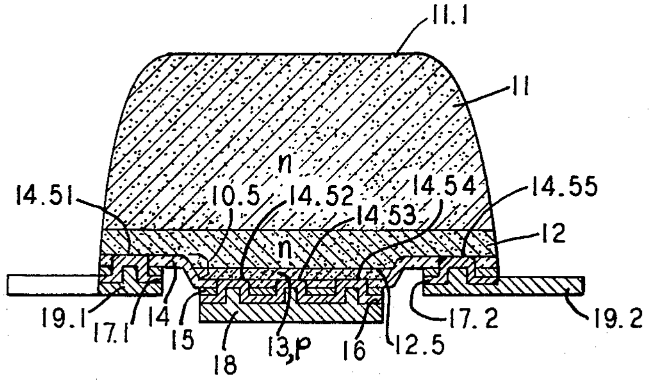
FIG. 2 is a cross-section view of the device shown in FIG. 1.

As further shown in cross-section in FIG. 2, this electroluminescent semiconductor device 10 includes an N-type gallium phosphide semiconductor monocrystal body 11, an epitaxial N-type gallium phosphide layer 12, and a P-type epitaxial layer 13. Typically, the thickness of the crystal 11 is of the order of 10 mil, whereas the thickness selenium concentration 16 of each of the epitaxial layers 12 and 13 is typically only about 20 microns. Moreover, the net significant donor impurity concentration in the epitaxial layer 12 is advantageously higher than that in the crystal body 11. For example, the body 11 has a (uniform) donor impurity concentration in the range of about $1 \times 10^{17}$ to $2 \times 10^{17}$ net significant selnium (donor) atoms per $cm^3$ whereas the epitaxial layer 12 has a (uniform) donor impurity concentration in the range of about $5 \times 10^{17}$ to $15 \times 10^{17}$ net significant tellurium (donor) atoms per $cm^3$. Typically, the P-type epitaxial layer 13 has a uniform acceptor impurity concentration of about $2 \times 10^{17}$ to $7 \times 10^{17}$ net significant zinc (acceptor) atoms per $cm^3$ together with zinc-oxygen pairs in a concentration of about $2 \times 10^{16}$ to $8 \times 10^{16}$ per $cm^3$. Advantageously, the P-type layer 13 is located in a mesa shaped portion 10.5 of the device 10 on a major surface thereof, as shown in FIG. 2. Likewise, a portion of the N-layer 12 is also located within this mesa portion 10.5 and the remainder of the N-layer 12 is located contiguous thereto and removed therefrom. A P-N junction 12.5 is formed at the interface of the layers 12 and 13 across an entire plane of the mesa 10.5. A silicon dioxide dielectric layer 14, typically about 3,000 to 5,000 A thick, coats the major surface of the device 10, except for apertures 14.51 through 14.55 therein. This silicon dioxide layer 14 serves both as a reflector of the light generated within the device 10 and as an electrically insulating and protective coating therefor particularly of the exposed perimeter of the junction 12.5. Upon this layer 14 is disposed an electrically conducting chromium and gold layer 15, typically about 1,000 A thick. This chromium and gold layer 15 serves as an adhesive for the attachment of a gold (≈ 1 percent beryllium) electrode layer 16 and a pair of gold (≈ 2 percent silicon) electrodes 17.1 and 17.2. The electrode layer 16 serves as ohmic electrical contact to the P zone 13, while the electrodes 17.1 and 17.2 serve as ohmic contacts to the N zone 12. An integral gold beam lead electrode 18 contacts the electrode layer 15, in order to provide a pair of terminals 18.1 and 18.2 for external electrical access to the P layer 13 through the apertures 14.52 through 14.54 in the silicon dioxide dielectric layer 14 on the plateau of the mesa 10.5. Finally, a pair of gold beam leads 19.1 and 19.2 contact the electrodes 17.1 and 17.2 respectively, in order to provide electrical access to the N layer 12 at the pair of electrically separate apertures 14.51 and 14.55 in the silicon dioxide dielectric layer 14 removed from the mesa 10.5.

Figure 3:
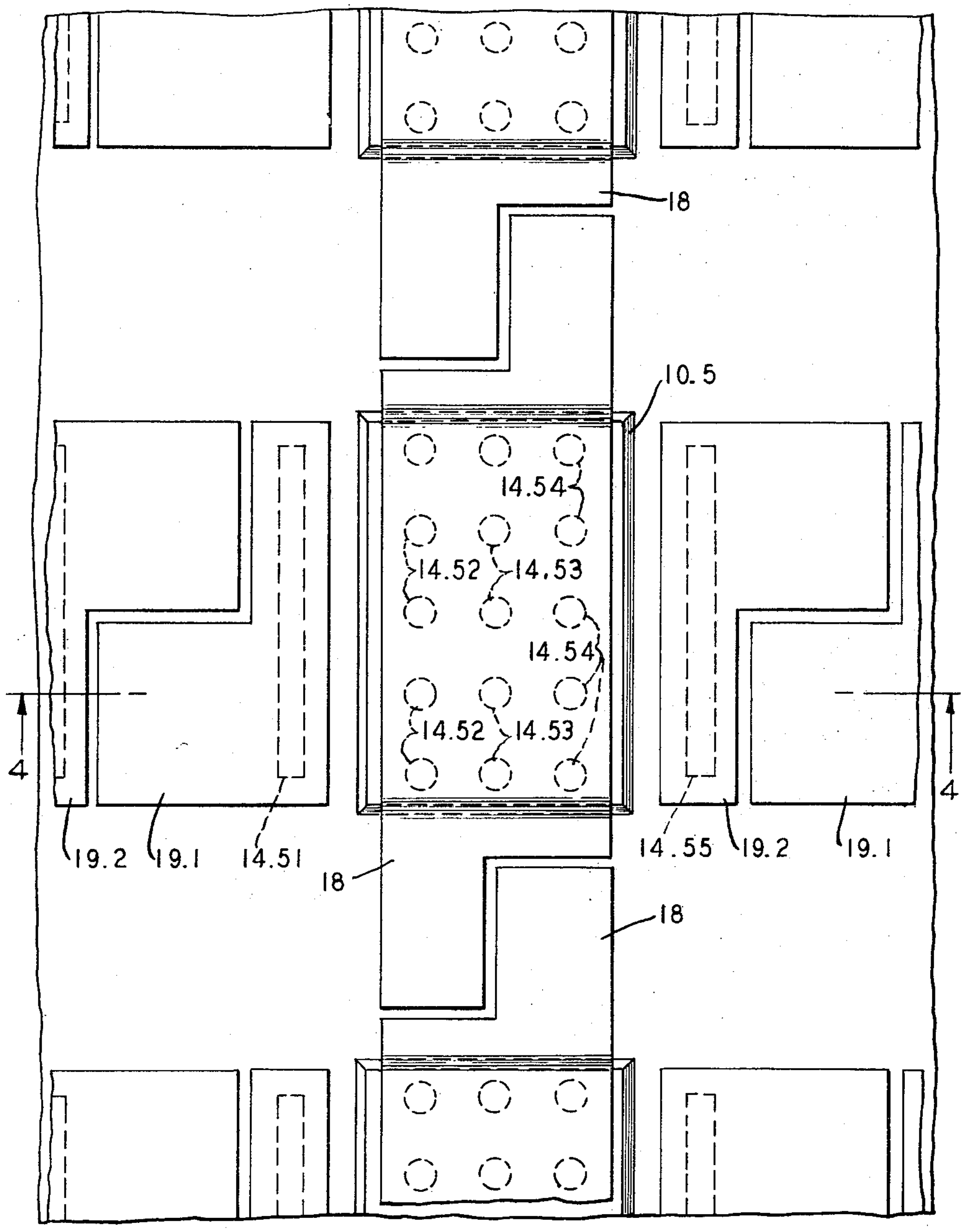
FIG. 3 is a bottom view of the electroluminescent semiconductor device shown in FIG. 2 in an intermediate stage of its manufacture.
Figure 4:
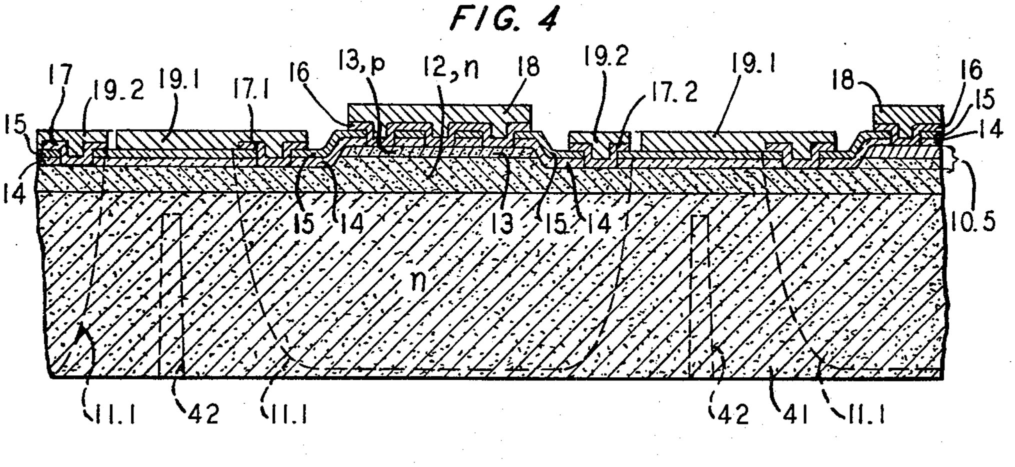
FIG. 4 is a cross-section view of the device shown in FIG. 3.

In order to fabricate the device 10, with reference to FIGS. 3 and 4, an N-type epitaxial layer is grown to a thickness of about 20 microns upon a major phosphorus (1,1,1) surface of an N-type gallium phosphide semiconductor single crystal wafer substrate. The concentration of net significant impurities in the crystal substrate and the epitaxial layer are as stated above for the body 11 and the epitaxial layer 12, respectively. (Ultimately, the body 11 is to be formed from the N-type crystal substrate.) Typically, the crystal body substrate is fabricated by the liquid encapsulated Czochralski technique, and the N-type epitaxial layer is grown typically by the method of liquid phase epitaxy. Thereafter, upon the exposed surface of the N-type epitaxial layer, a P-type epitaxial layer is grown. Typically, the P-type layer is grown by liquid phase epitaxy to a thickness of about 20 microns. Thereby, a P-N junction is formed at the interface of the P-type and N-type epitaxial layers. A suitable technique for growing both of these epitaxial layers is described in detail, for example, by R. H. Saul, J. Armstrong and W. H. Hackett, Jr., in *Applied Physics Letters*, Vol. 15, No. 7, page 229 (Oct. 1, 1969).

In order to fashion the mesa portion 10.5 of the epitaxial layers in the device 10, the entire exposed surface of the P-type epitaxial layer is coated with a layer of silicon dioxide dielectric material, typically about 3,000 to 5,000 A thick, by vapor deposition for example. This layer of silicon dioxide dielectric is selectively masked, and etched with hydrofluoric acid, in order to form rectangularly shaped islands of silicon dioxide dielectric, typically about 10 by 15 mil. Advantageously, one of the sides of the rectangular islands is parallel to the (1,1,0) crystallographic direction in the gallium phosphide crystal. The exposed portion of the P-type epitaxial layer (i.e., between the silicon dioxide islands) is then etched with a crystallographic etching solution, typically a solution of hydrochloric acid and nitric acid. This etching process is allowed to continue until mesas are formed, with a height of about 1 mil, each of which contains a portion of the P-N junction previously formed between the P-type and N-type epitaxial layers. Then the remaining silicon dioxide dielectric is etched away and the exposed major surface is coated again with a fresh layer of silicon dioxide dielectric about 3,000 to 5,000 A thick, thereby forming the layer 14 indicated in FIG. 4. Upon the exposed surface of this dielectric layer 14 is deposited, typically by evaporation, a layer of electrically conductive material 15, advantageously chromium and subsequently gold for a total thickness of about 1,000 A, which is adherent to the dielectric layer 14. As indicated by the dotted lines in FIG. 3, circular apertures 14.52–14.54, and rectangular apertures 14.51 and 14.55, are formed through the layers 14 and 15, in order to expose the corresponding portions of the P-type and N-type zones respectively. Typically, each of the circular apertures 14.52–14.54 has a diameter of about 1 mil, with a spacing of about 3 mils between centers of next neighboring apertures. Thus, the total area of the apertures is less than one-third of the area of the plateau surface of the mesa 10.5. On the other hand, each of the rectangular apertures 14.51 and 14.55 is about 1 × 13 mils, these apertures being spaced in pairs (as indicated in FIG. 4) at a distance of about 16 mils apart. By appropriate selective masking, the electrode layer 16 is deposited, typically by evaporation, onto the mesa portions 10.5, in order to form a continuous electrode layer contact to the P-type gallium phosphide through the apertures 14.52–14.54. Likewise, the electrodes 17.1 and 17.2 are deposited, typically by evaporation, through appropriate masks. Thereafter, upon the exposed surfaces of the electrodes 16, 17.1 and 17.2 are fabricated the gold beam leads 18, 19.1, and 19.2 respectively, typically using known techniques of selective electroplating.

At this point, the process has been carried through the stage indicated in FIG. 4 (except for the dotted lines). Then all the exposed portions of the electrically conductive layer 15 are etched away, by immersion in an etching solution, typically an iodine and potassium iodide solution to etch the gold followed by a Kodak chromium etch, in order to break the otherwise short-circuiting electrical contact between adjacent beam leads 18, 19.1, and 19.2

Figure 5:
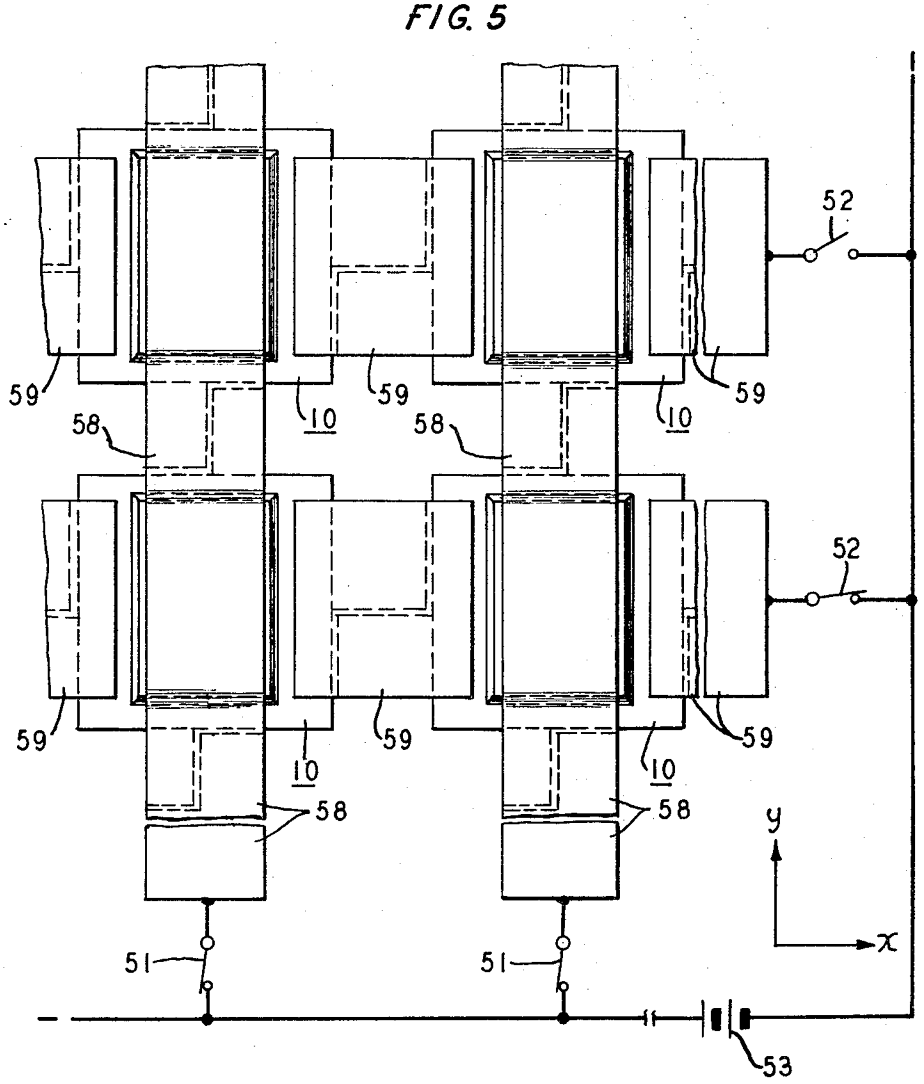
FIG. 5 is a plan view of an alphanumeric electroluminescent display apparatus, according to another feature of this invention.

In order to provide an individual device 10, the body 41 shown in FIG. 4 is flipped over and its electrodes are cemented onto a dicing platform where a slurry saw is used to cut wedges 42, as indicated in FIG. 4. Typically, each wedge 42 is about 6 mils wide and 8 mils deep. Then, the bottom surface (as viewed in FIG. 4) of the body 41 is treated with an isotropic etching solution, such as chlorine saturated methanol, or a solution of hydrochloric acid and nitric acid followed by a solution of hydrofluoric acid and nitric acid, in order to provide individual devices 10 with rounded and polished surfaces 11.1. At this point, each of the devices 10 are individually pretested for electroluminescence and only the satisfactory devices are selected for further use. The beam leads 18, 19.1 and 19.2 of this selected group of devices 10 are then affixed, typically by means of thermal compression bonding, to arrays 58 and 59 of interconnectors as shown in FIG. 5. Typically, gold leads on a ceramic plate (not shown) serve as these interconnectors. The array 58 is electrically connected through electrical switches 51 to a positive terminal of a battery 53; whereas the array 59 is electrically connected through electrical switches 52 to the negative terminal of the battery 51. Thereby, forward voltage bias is supplied only to those devices 10 located at the intersection of those rows (in the $x$ direction) and columns (in the $y$ direction) whose switches 52 and 51, respectively, are closed. Thus, the luminescence (or not) from each diode 10 is individually controllable by the corresponding selection of closing (and opening) of the switches 51 and 52. With the configuration of open and closed switches indicated in FIG. 5, for purposes of illustration only, the bottom two diodes 10 are the only diodes which are luminescent ("on") and all other diodes 10 are not luminescent ("off"), assuming that all other switches are open except for those shown to be closed.

Some of the advantageous features of the device 10 may be readily appreciated. With particular reference to FIG. 2 and 3, visible light is generated in the neighborhood of the P-N junction 12.5 in the mesa 10.5. That portion of the generated light, which initially propagates away from the plateau surface of the mesa 10.5, traverses the body 11 and is emitted through the rounded and polished surface 11.1 thereof for utilization. On the other hand, most of that portion of the generated light, which initially propagates towards the plateau surface of the mesa 10.5, strikes the reflecting dielectric layer 14, and is thereby reflected back through the P-N junction 12.5, through the body 11, and also through the surface 11.1 for utilization.

Thus, only a small fraction of the generated light is absorbed by the electrode 16. Moreover, because of the distribution of apertures 14.52–14.54 (through which electrical contact of the lead 18 to the P zone 13 is established), the P-N junction 12.5 substantially uniformly generates light over the whole area of this P-N junction, so that the visible light emitted through the surface 11.1 has a substantially uniform distribution in space; that is, the surface 11.1 of the diode 10 appears substantially uniformly bright when this diode is turned "on." Another advantageous feature of the device 10 resides in the fact that, owing to the difference in net significant impurity concentrations, the electrical conductivity of the relatively thin layer 12 is higher than that of the relatively thick body 11. Thus, the light absorptivity of the body 11 is less than that of the layer 12, so that light absorption losses are minimized whereas electrical conductivity from electrode 19.1 to 19.2 is optimized while Joule heat losses are minimized.

Although this invention has been described in detail with reference to a specific embodiment, various modifications can be made by the skilled worker without departing from the scope of the invention. Instead of silicon dioxide, protective insulating layers such as aluminum oxide or titanium oxide can be used for the layer 14. In addition, instead of liquid phase epitaxy, vapor deposition epitaxial techniques can be utilized in the growth of either the epitaxial layer 12 or 13 or both. Such techniques are known in the art and are described, for example, in an article by Mahn-Sick Lim in *Extended Abstracts of the Electrochemical Society Meeting*, October 4–8, 1970, page 432. In addition, the body 11 can be semi-intrinsic semiconductor or even of opposite conductivity type semiconductor from that of the epitaxial layer 12. Of course, homologous semiconductor structures (i.e., P- and N-type reversed from above detailed description) can likewise be used.

When individual pretesting is not required (due to sufficiently high yield of devices), the electrodes 18, 19.1, and 19.2 can be formed initially such that the electrode 18 (in FIG. 3) is a continuous integral strip in the form of one of the electrodes 58 (in FIG. 5) and the electrodes 19.1 and 19.2 are initially connected together in pairs in the form of the electrodes 59 (in FIG. 5). Thus, immediately after formation of these electrodes, the array of devices 10 is ready for bonding the entire array directly onto the ceramic substrate (not shown) for mechanical support.

What is claimed is:

1. An electroluminescent device, amenable for connection into an array to provide a display, comprising:
   a. a semiconductive crystal including a base portion and a continuous mesa portion extending from the base portion, the mesa portion including first and second zones respectively of first and second conductivity types defining a P-N junction therebetween, the first zone including a major surface of the mesa;
   b. an apertured reflective dielectric layer extending over the major surface of the mesa, said layer having a plurality of apertures through each of which the first zone of the mesa can be electrically contacted by an electrode;
   c. a conductive coating extending over said dielectric layer and contacting electrically the first zone of the mesa at each of the apertures in said layer;
   d. a pair of spaced apart electrical terminals oppositely connected to said coating; and
   e. a pair of spaced apart electrical terminals contacting the base at separate locations, the base including both a first region of low electrical conductivity of a second type, and a second region including said separate locations at its boundary and having high electrical conductivity of the same conductivity type as said second zone, said second region extending in the base from both said locations to the second zone.

2. A device in accordance with claim 1 in which the conductive coating over the insulating layer and the two electrical terminals connected thereto form an integral beam lead, and in which the total area of the apertures is less than one-third of the area of the major surface of the mesa.

3. A device in accordance with claim 1 in which the P-N junction forms a surface which is essentially parallel to the major surface of the mesa, and in which a portion of the dielectric layer extends over the intersection of the P-N junction with the sides of the mesa.

4. The device of claim 1 in which the semiconductor of the base and the mesa is essentially gallium phosphide.

5. The device of claim 4 in which the second region and the second zone are both essentially N-type gallium phosphide which has been epitaxially grown on an exposed surface of the first region.

6. The device of claim 3 in which the first zone is epitaxially grown upon a major exposed surface of the second zone.

7. The device of claim 6 in which the first and second zones are both gallium phosphide.

8. The device of claim 7 in which the second zone is N-type gallium phosphide.

9. The device of claim 8 in which the first region has a net significant donor impurity concentration in the range of less than about $2 \times 10^{17}$ per $cm^3$, and the second region and the second zone have a net significant donor impurity concentration in the range of about $5 \times 10^{17}$ to $15 \times 10^{17}$ per $cm^3$.

10. The device of claim 9 in which the first zone has a net significant acceptor impurity concentration of about $2 \times 10^{17}$ to $7 \times 10^{17}$ per $cm^3$.

* * * * *

UNITED STATES PATENT OFFICE

CERTIFICATE OF CORRECTION

Patent No. 3,667,004 Dated May 30, 1972

Inventor(s) Matthew Kuhn and Norman E. Schumaker

It is certified that error appears in the above-identified patent and that said Letters Patent are hereby corrected as shown below:

Column 2, line 56, delete "selenium concentration".

line 57, delete "16".

line 62, "selnium" should read --selenium--.

line 70, "per $cm^3$" should not be superscript.

Signed and sealed this 28th day of November 1972.

(SEAL)
Attest:

EDWARD M.FLETCHER,JR.
Attesting Officer

ROBERT GOTTSCHALK
Commissioner of Patents